(12) United States Patent
Shiao et al.

(10) Patent No.: US 7,432,702 B2
(45) Date of Patent: Oct. 7, 2008

(54) CIRCUIT BOARD DAMPING ASSEMBLY

(75) Inventors: Sam Shiao, Cerritos, CA (US); Robert P. Chen, Torrance, CA (US)

(73) Assignee: Honeywell International Inc., Morristown, NJ (US)

( * ) Notice: Subject to any disclaimer, the term of this patent is extended or adjusted under 35 U.S.C. 154(b) by 166 days.

(21) Appl. No.: 11/321,297

(22) Filed: Dec. 22, 2005

(65) Prior Publication Data

US 2007/0145996 A1    Jun. 28, 2007

(51) Int. Cl.
*G01R 31/28* (2006.01)

(52) U.S. Cl. .................... 324/158.1; 361/742

(58) Field of Classification Search ........... 361/683, 361/679, 680, 685, 800, 752, 721, 730, 784, 361/760, 797, 792; 439/66
See application file for complete search history.

(56) References Cited

U.S. PATENT DOCUMENTS

| | | | |
|---|---|---|---|
| 3,462,540 A * | 8/1969 | Harris Jr. et al. ........... 174/254 |
| 3,742,309 A | 6/1973 | Sterner | |
| 3,904,934 A * | 9/1975 | Martin .................... 361/803 |
| 4,514,784 A * | 4/1985 | Williams et al. ........... 361/716 |
| 4,636,018 A * | 1/1987 | Stillie .......................... 439/66 |
| 4,929,185 A * | 5/1990 | Wong et al. ................. 439/74 |
| 5,049,982 A * | 9/1991 | Lee et al. .................... 257/722 |
| 5,334,029 A * | 8/1994 | Akkapeddi et al. ........... 439/66 |
| 5,575,686 A * | 11/1996 | Noschese ............... 439/620.21 |
| 5,672,062 A * | 9/1997 | Lindeman .................... 439/66 |
| 5,841,638 A | 11/1998 | Purdom et al. | |
| 5,933,343 A * | 8/1999 | Lu et al. .................... 363/144 |
| 5,999,414 A | 12/1999 | Baker et al. | |
| 6,065,977 A * | 5/2000 | Toda et al. .................... 439/66 |
| 6,287,126 B1 * | 9/2001 | Berger et al. ................. 439/66 |
| 6,462,540 B1 * | 10/2002 | Kandori et al. ............. 324/248 |
| 2005/0233610 A1 * | 10/2005 | Tutt et al. ..................... 439/66 |

\* cited by examiner

*Primary Examiner*—Ha Nguyen
*Assistant Examiner*—Richard Isla Rodas
(74) *Attorney, Agent, or Firm*—Oral Caglar, Esq.

(57) ABSTRACT

A circuit board damping assembly provides a damping node for a circuit board coupled in spaced relationship to another circuit board or chassis. The circuit board damping assembly includes a chassis or circuit board forming a base member; a circuit board coupled in spaced relationship to the base member; a first attachment member coupled to the base member; a second attachment member coupled to the circuit board; and a connector coupled between the first and second attachment members. The connector may be a wire coupled to the first and second attachment members.

15 Claims, 8 Drawing Sheets

CIRCUIT BOARD DAMPING ASSEMBLY

BACKGROUND OF THE INVENTION

The present invention relates generally to an apparatus for providing a damping devise for a circuit board coupled in spaced relationship to another circuit board or chassis.

Circuit card assembly spacers are typically used between two circuit boards or between a circuit board and chassis to maintain the minimum spacing requirement and provide support for the circuit boards under vibration loads. The spacer height, weight, and tolerance are major factors in selecting a particular spacer. However, there are cases where a minimal number of spacers are provided because of the above concerns, components installation interference, or simple neglect during the design of the circuit card assembly. All of these issues result in a more flexible circuit board more prone to vibration damage. The spacing members are commonly positioned adjacent to corners of the circuit board and the circuit board itself is commonly rectangular having a pair of long sides. For any of the above reasons, the long sides may be left unsupported between the spacing members permitting vibration in the circuit board substantial enough to cause damage of electronic components which are attached to the circuit board.

U.S. Pat. No. 5,999,414 provides a very elaborate system including a contact, protruding end, curved top section, elastomeric insert, and fasteners to hold a stack of printed circuit boards together. The system provides resistance against excessive shock and vibrations, and electrical power (signals) conduction between the boards. However, this design is relatively complex, permits heat exchange between circuit boards, and inhibits access to the circuit boards without disassembly and separation of the stacked circuit boards.

U.S. Pat. No. 5,841,638 provides a method of stacking a collection of printed circuit boards for a crash-proof flight recorder utilizing a spacer or standoff. The spacer of this prior art reference performs both support and electrical conduction similar to the structure of the device taught in the U.S. Pat. No. 5,999,414 patent. Similarly, this design is also relatively complex, permits heat exchange between circuit boards, and inhibits access to the circuit boards without disassembly and separation of the stacked circuit boards.

U.S. Pat. No. 3,904,934 provides electrical interconnections, thermal control and mechanical integrity in electronic systems where the disclosed electrical systems comprise circuit boards and supports alternately stacked circuit boards between two thick pressure plates. Clamp screws provide clamping pressure for the electronic assembly during fabrication. Leaf springs are used as coupling and flexure compensating elements extending along two complete edges. Again, this design is relatively complex, permits heat exchange between circuit boards, and inhibits access to the circuit boards without disassembly and separation of the stacked circuit boards.

As can be seen, there is a need for damping of vibration of a circuit board coupled in spaced relationship to another circuit board or chassis without electrical or heat conduction between boards. Further, there is a need for a damping assembly that is easily installed or removed to maintain some access to the circuit board without complete disassembly of the circuit card assembly.

SUMMARY OF THE INVENTION

In one aspect of said invention, a circuit board damping assembly comprises a base member; a circuit board coupled in spaced relationship to the base member; a first attachment member coupled to the base member; a second attachment member coupled to the circuit board; and a connector coupled between the first and second attachment members.

In another aspect of the invention, a circuit board damping assembly comprises a base member; a circuit board coupled in spaced relationship to the base member, a pair of spacing members, each of the spacing members being coupled to the base member and the circuit board, wherein the spacing members are positioned in spaced relationship to each other defining a medial portion of the circuit board extending between the pair of spacing members; a first attachment member coupled to the base member; a second attachment member coupled to the medial portion of the circuit board; and a connector coupled between the first and second attachment members.

In a further aspect of said invention, a circuit board damping assembly comprises a first circuit board; a second circuit board coupled in spaced relationship to the first circuit board; at least two spacing members, each of the spacing members being coupled to the first and second circuit boards, the spacing members being positioned in spaced relationship to each other defining respective medial portions of the first and second circuit boards extending between the pair of spacing members; a first wire washer coupled to the medial portion of the first circuit board, the first wire washer having an aperture; a second wire washer coupled to the medial portion of the second circuit board, the second wire washer having an aperture, the aperture in the second wire washer being aligned with the aperture in the first wire washer; and a wire connecting the first and second wire washers such that the wire, the first wire washer, and the second wire washer form a node between the spacing members for damping vibration of the first and the second circuit boards.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention provides a circuit board coupled in spaced relationship to a second circuit board or a chassis, a pair of attachment members coupled to the circuit board and the second circuit board or chassis, and a connector extending between the attachment members to form a node.

The present invention is applicable to any situation in which circuit card assemblies are currently utilized, particularly those in which vibration is expected and weight is a concern such as, but not limited to, use in aircrafts.

The present invention differs from the prior art by providing a circuit board in spaced relationship to either another circuit board or a chassis, a pair of attachment members, and a connector coupled to extend between the attachment members forming a node. Thus, the present invention provides a lightweight, nonconductive, single point, simplified assembly to reduce displacement of a circuit board in a circuit card assembly under vibrational stress. The present invention provides a combination of reduced displacement, simplified installation, light weight, easy removal, and facilitates access to the circuit card without having to fully remove the invention or disassemble the circuit card assembly. This differs significantly from the prior art which permits heat exchange between circuit boards, and inhibits access to the circuit boards without disassembly and separation of the stacked circuit boards.

Figure 1:
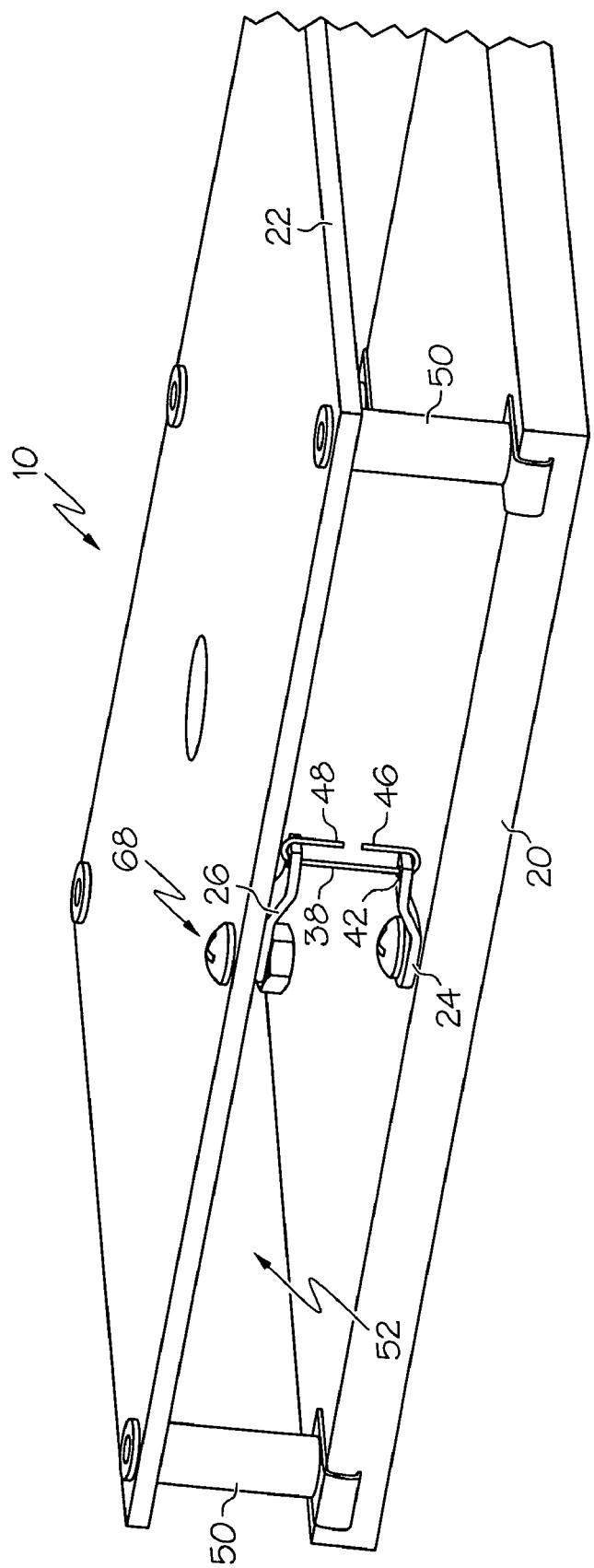
FIG. 1 is a perspective view of an embodiment of the present invention.

As shown in FIG. 1, a circuit board damping assembly 10 may include a base member 20, a circuit board 22 coupled in spaced relationship to the base member 20, a first attachment member 24 coupled to the base member 20, a second attachment member 26 coupled to the circuit board 22, and a connector 38 coupled to and extending between the first and second attachment members 24, 26.

Figure 2:
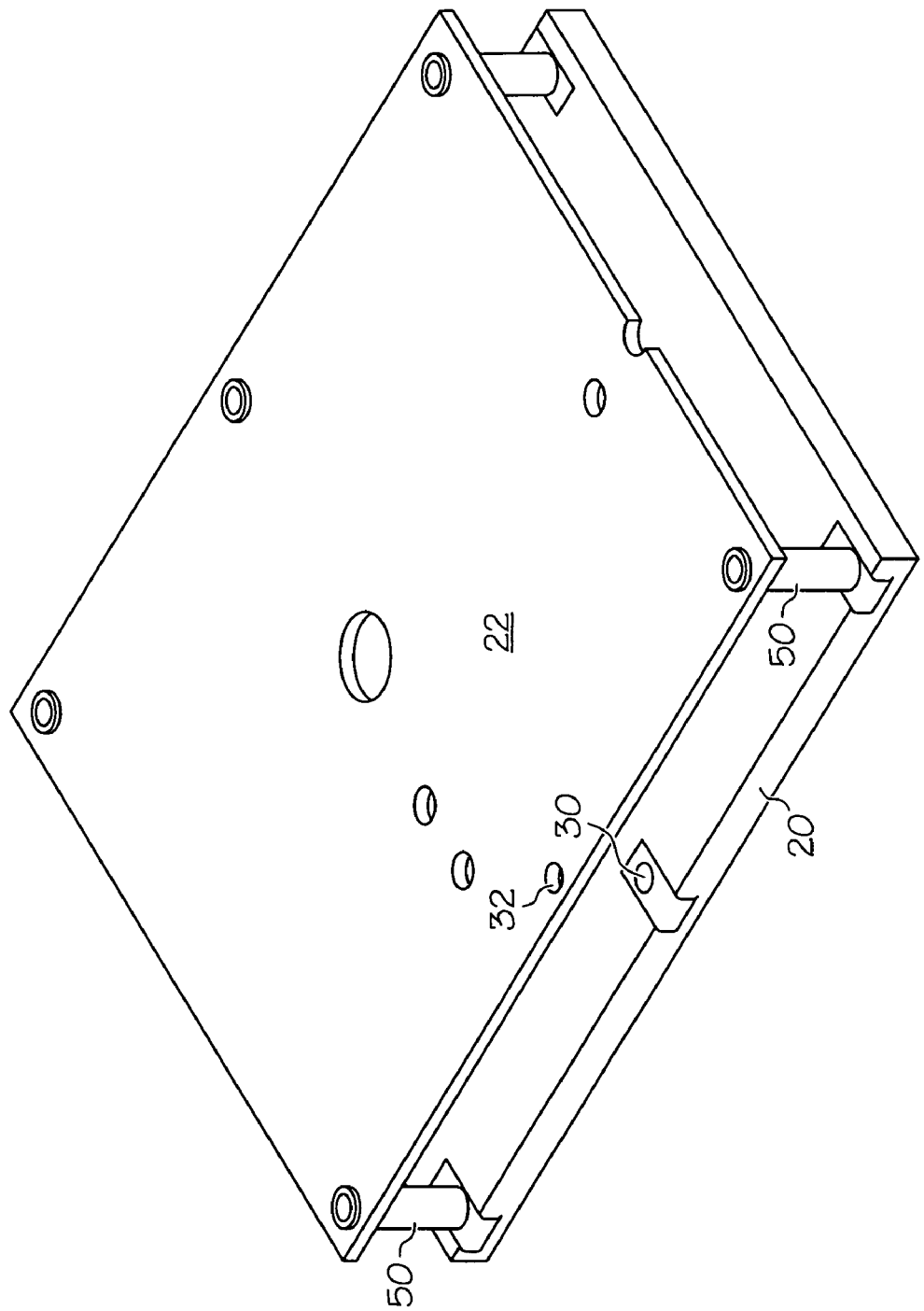
FIG. 2 is a perspective view of the circuit board spacing of the present invention.

The base member 20 may include a base member hole 30 as seen in FIG. 2, and the first attachment member 24 may be coupled to the base member hole 30. The circuit board 22 may include a circuit board hole 32 as seen in FIG. 2 and the second attachment member 26 may be coupled to the circuit board hole 32. Attachment may be achieved either by use of a commonly known attachment device such as a nut and bolt, or may be achieved by insertion of an integral portion of either attachment member 24, 26 through the respective hole 30, 32 in a commonly known manner that secures the first and second attachment members 24, 26 to the base member 20 and circuit board 22 respectively.

Figure 3:
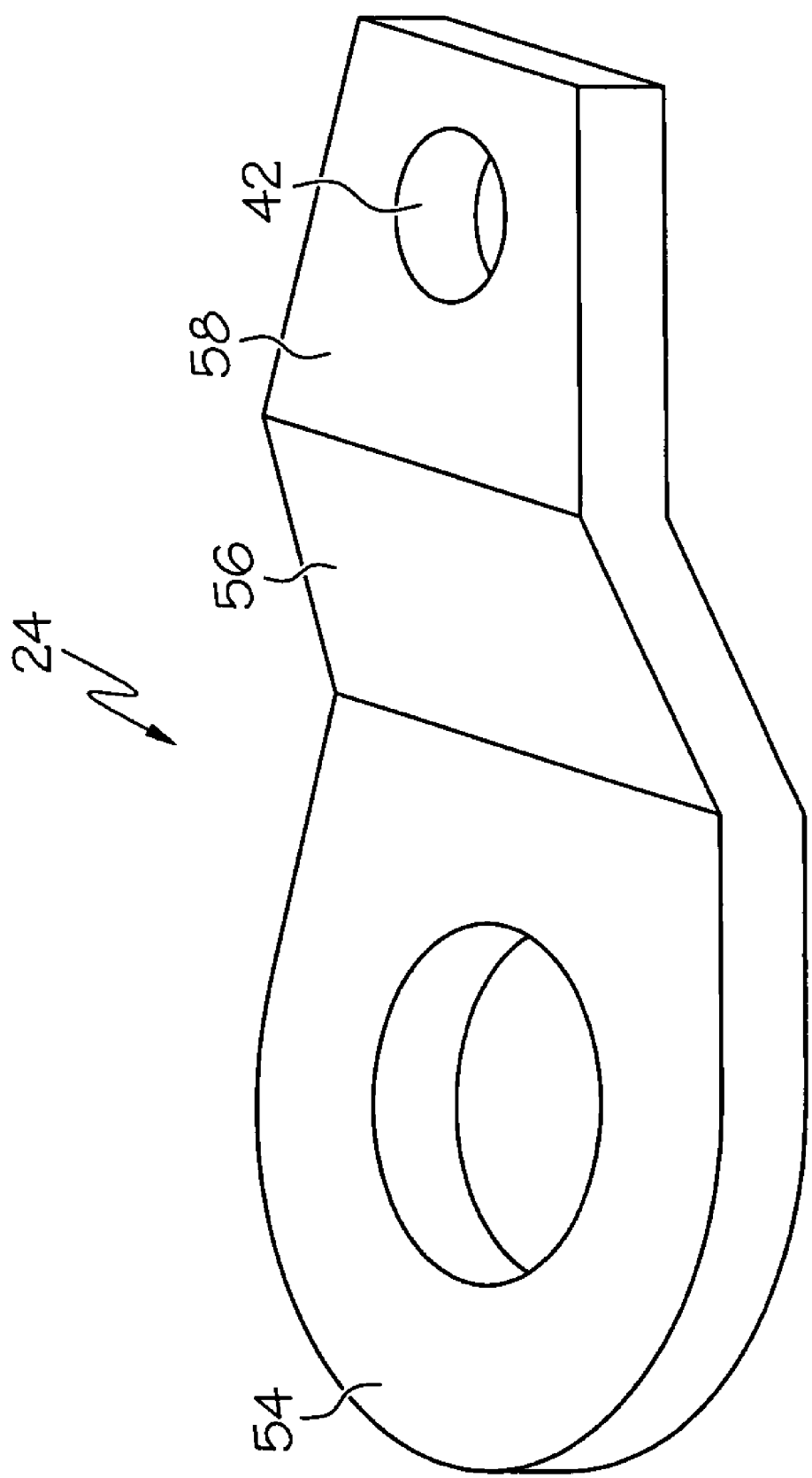
FIG. 3 is an enlarged view of a wire washer of FIG. 1 of the present invention.
Figure 6:
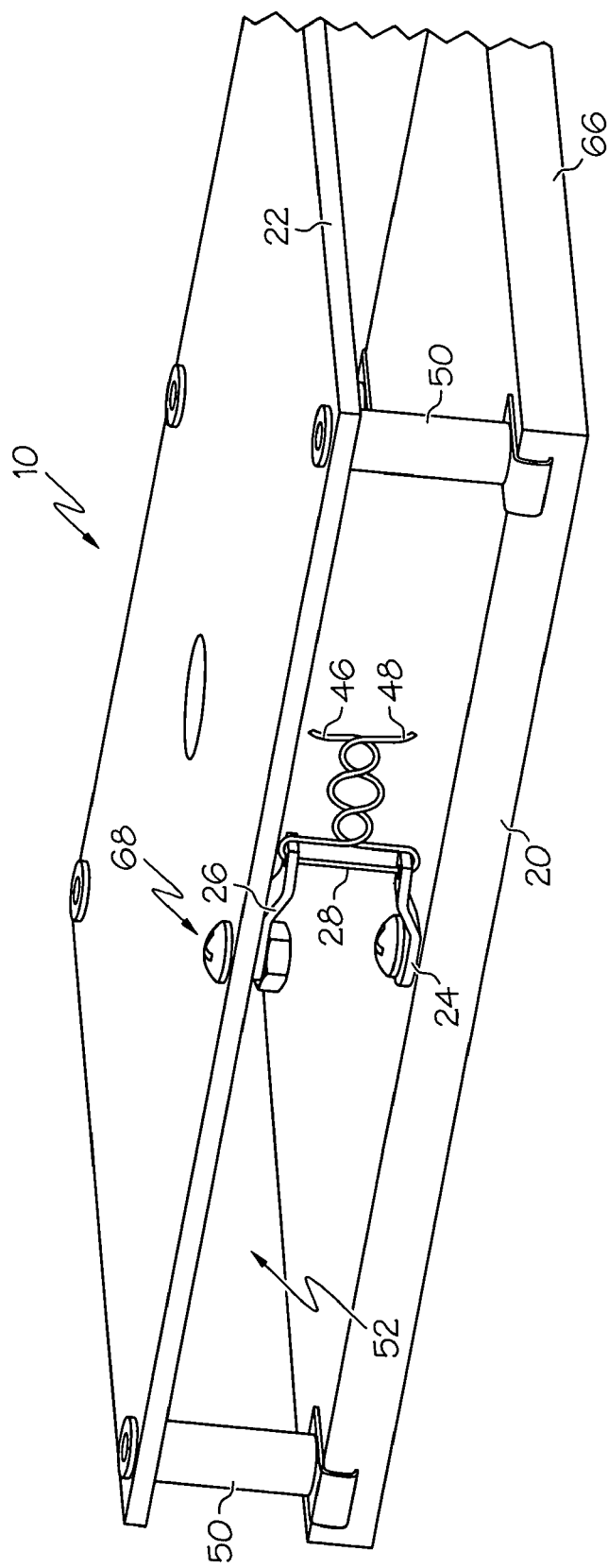
FIG. 6 is a perspective view of another alternate embodiment of the present invention.

The base member 20 may be, but not limited to, a chassis or a second circuit board. The connector 38 may be a wire having sufficient cross-sectional diameter and stiffness to provide the desired damping effect. The first and second attachment members 24, 26 may each be, but not limited to, a wire washer. The wire washer may include an aperture 42 as shown in FIG. 3, with the connector 38 passing through the apertures 42 as shown in FIG. 1. The wire, or connector, 38 may pass through the aperture 42 as shown in FIG. 6. Distal portion 46, 48 of the wire 38 may be twisted back towards each other as shown in FIG. 1, or alternately, the distal portions 46, 48 when sufficiently long, may be twisted together to secure the wire 38 to the first and second attachment members 24, 26 as shown in FIG. 6.

In an embodiment of the invention, the circuit board 22 may be coupled in spaced relationship to the base member 20 using at least a pair of spacing members 50 as shown in FIGS. 1, 2, 5, and 6. Each of the spacing members 50 may be coupled to the base member 20 and the circuit board 22. The spacing members 50 may be positioned in spaced relationship to each other. A medial portion 52 of the circuit board 22 extends between the pair of spacing members 50. The first attachment member 24 may be coupled to the base member 20 and the second attachment member 26 may be coupled to the medial portion 52 of the circuit board 22. The connector 38 may be coupled between the first and second attachment members 24, 26. The circuit board hole 32 may be positioned in the medial portion 52 of the circuit board 22. The second attachment member 26 may be coupled to the circuit board hole 32.

Figure 5:
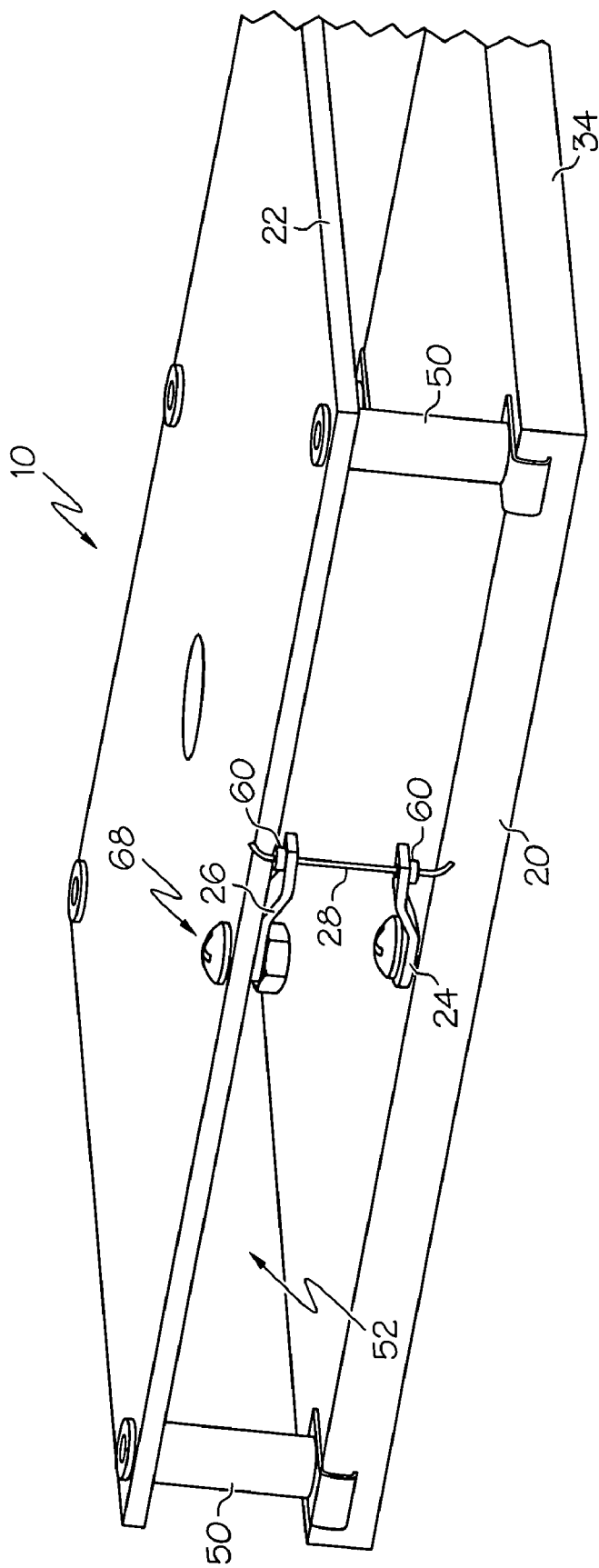
FIG. 5 is a perspective view of an alternate embodiment of the present invention.

The first and second attachment members 24, 26 may have similar structure as shown in FIG. 3 including a connection portion 54, an offset portion 56, and a distal portion 58. The distal portion 58 may be positioned in spaced relationship to the base member 20 and the circuit board 22 respectively when the first and second attachment members 24, 26 are coupled to the base member 20 and the circuit board 22 respectively. The apertures 42 in the first and second attachment members 24, 26 may extend through the distal portions 58 of the first and second attachment members 24, 26. As shown in FIG. 5, a locking member 60 such as a locking nut may be coupled to the connector 38 for securing the connector 38 to one of the first and second attachment members 24, 26.

In a further embodiment a first circuit board 22 may be coupled in spaced relationship to the second circuit board 66 as shown in FIG. 6. At least two spacing members 50 may be coupled to the first circuit board 22 and the second circuit board. The spacers 50 may be positioned in spaced relationship to each other. Respective medial portions 52 of the first circuit board 22 and the second circuit board 66 extend between the spacing members 50. A first wire washer may be coupled to the medial portion 52 of the first circuit board 22. The first wire washer may include an aperture 42. The second wire washer may be coupled to the medial portion 52 of the second circuit board. The second wire washer may also include an aperture 42. The aperture 42 in the second wire washer may be aligned with the aperture 42 in the first wire washer. The wire 38 may pass through the apertures 42 in the first and second wire washers 24, 26 to connect the first and second wire washers 24, 26 such that the wire 38, the first wire washer 24, and the second wire washer 26 form a node 68 (see FIG. 6) between the spacing members 50 for damping vibration of the first circuit board 22 and the second circuit board 66. The first and second wire washers 24, 26 may be coupled to the first circuit board 22 and the second circuit board 66 equidistant between the spacing members 50. Each of the first and second wire washers 24, 26 may have the structure as shown in FIG. 3 including the connection portion 54, offset portion 56, and distal portion 58. The distal portion 58 may be positioned in spaced relationship to the first circuit board 22 and the second circuit board 66 respectively when the first and second wire washers 24, 26 are coupled to the first circuit board 22 and the second circuit board 66. The apertures 42 in the first and second wire washers 24, 26 may extend through the distal portions 58 of the first and second wire washers 24, 26.

Figure 4A:
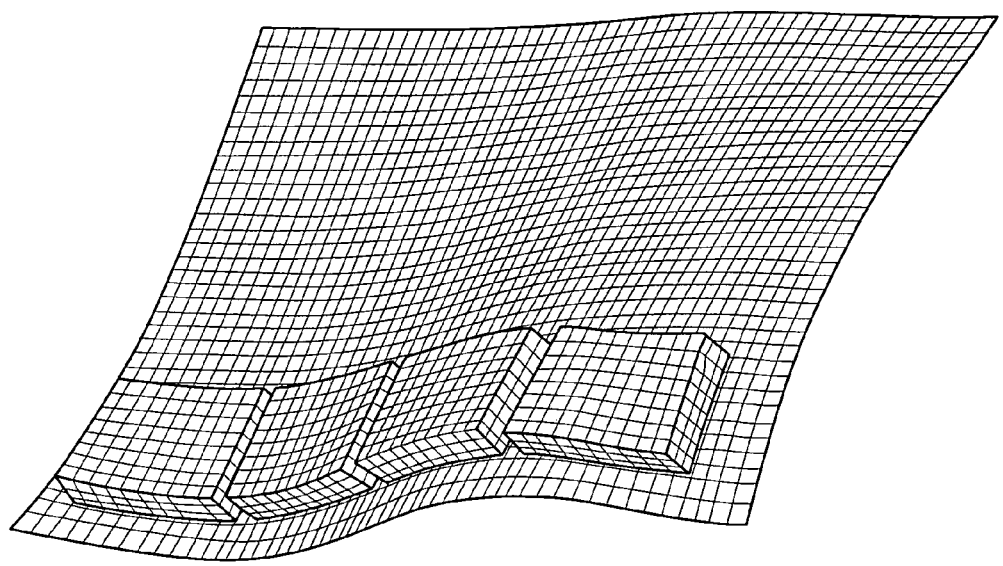
FIG. 4A is a graph of displacement, or mode shape in a circuit board for a resonance natural frequency of 107 Hz without the present invention.
Figure 4B:
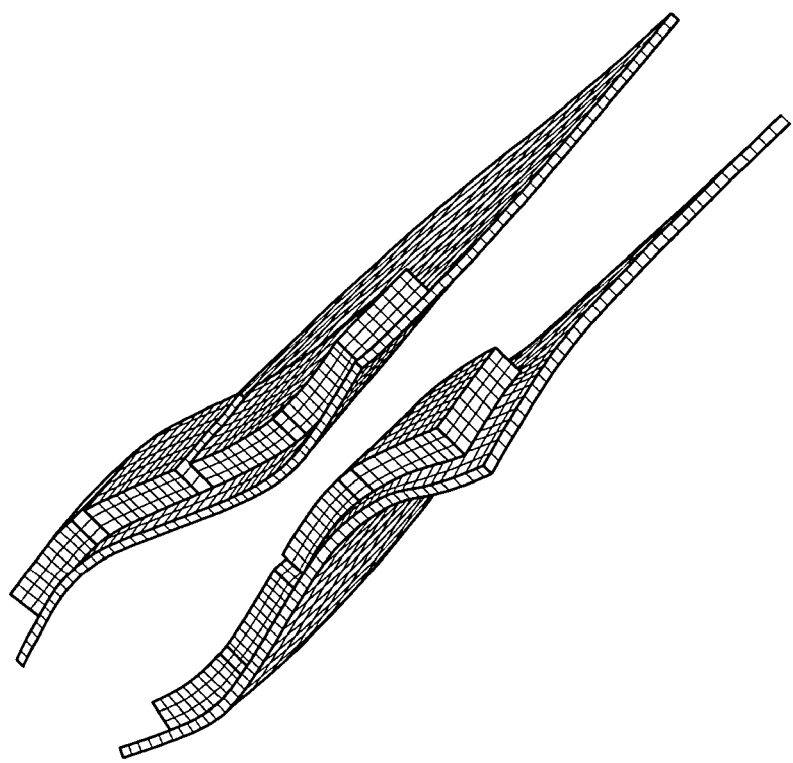
FIG. 4B is a graph of displacement, or mode shape in a pair of circuit boards using the present invention under increased resonance natural frequency of 127 Hz.

As shown by a comparison of FIGS. 4A and 4B, the use of the inventive assembly can provide lessened displacement in a circuit board under 127 Hz of vibration frequency compared to a circuit board without the inventive assembly under vibration frequency of 107 Hz.

Figure 7:
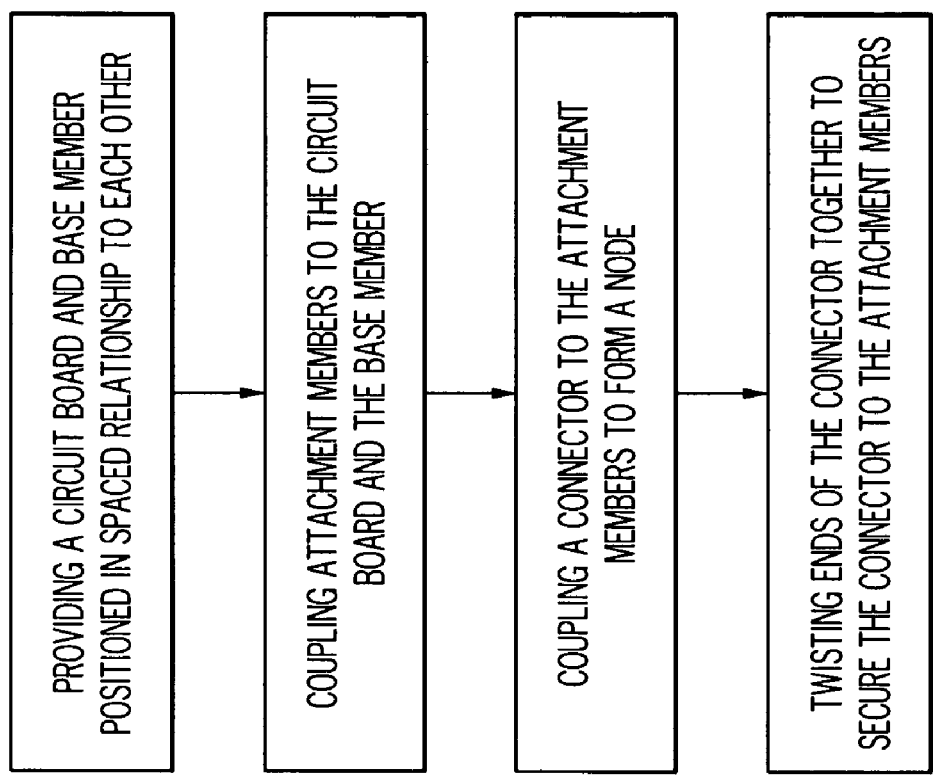
FIG. 7 is a flow chart of a method according to the present invention.

As shown in FIG. 7, a method of using the present invention includes the steps of providing a circuit board and a base member positioned in spaced relationship to each other, coupling attachment members to the circuit board and the base member, and coupling a connector to the attachment members to form a node. The connector may be a wire and may have sufficient length to permit the additional step of twisting ends of the connector together to secure the connector to the attachment members. Alternately, a step of securing the connector to the attachment members may utilize locking members as seen in FIG. 5.

It should be understood, of course, that the foregoing relates to exemplary embodiments of the invention and that modifications may be made without departing from the spirit and scope of the invention as set forth in the following claims.

We claim:

1. A circuit board damping assembly comprising:
   a base member;
   a circuit board coupled in spaced relationship to said base member;
   a first attachment member coupled to said base member;

a second attachment member coupled to said circuit board; and a connector coupled to and extending between said first and second attachment members, wherein said connector is a wire and wherein said first and second attachment members are wire washers and wherein the wire passes through said wire washers, and wherein distal portions of said wire are twisted together to secure said wire to said first and second attachment members.

2. The circuit board damping assembly of claim 1, further comprising:

said base member having a base member hole, said first attachment member being coupled to said base member hole.

3. The circuit board damping assembly of claim 1, further comprising:

said circuit board having a circuit board hole, said second attachment member being coupled to said circuit board hole.

4. The circuit board damping assembly of claim 1, wherein said base member is a circuit board.

5. The circuit board damping assembly of claim 1, wherein said base member is a chassis.

6. A circuit board damping assembly comprising:

a base member;

a circuit board coupled in spaced relationship to said base member;

a first attachment member coupled to said base member;

a second attachment member coupled to said circuit board; and a connector coupled to and extending between said first and second attachment members, wherein each of said first attachment member and said second attachment member has a respective aperture, said connector passing through said apertures in said first attachment member and said second attachment member, wherein said connector is a wire passing through said apertures; and wherein distal portions of said wire are twisted together to secure said wire to said first and second attachment members.

7. A circuit board damping assembly comprising:

a base member;

a circuit board coupled in spaced relationship to said base member;

a pair of spacing members, each spacing member in said pair of spacing members being coupled to said base member and said circuit board, wherein said spacing members are positioned in spaced relationship to each other;

a medial portion of said circuit board extending between said pair of spacing members, a first attachment member coupled to said base member;

a second attachment member coupled to said medial portion of said circuit board;

a connector coupled between said first and second attachment members, wherein each of said first and second attachment members has an aperture, said connector passing through said apertures, wherein said connector is a wire passing through said; and a circuit board hole positioned in said medial portion of said circuit board, said second attachment member being coupled to said circuit board hole, wherein distal portions of said wire are twisted together to secure said wire to said first and second attachment members.

8. The circuit board damping assembly of claim 7, wherein said first and second attachment members each have a connection portion, an offset portion, and a distal portion, said distal portion being positioned in spaced relationship to said base member and said circuit board respectively when said first and second attachment members are coupled to said base member and said circuit board respectively; and wherein said first and second attachment members each have an aperture extending through said distal portions of said first and second attachment members.

9. The circuit board damping assembly of claim 7, further comprising:

a locking member coupled to said connector for securing said connector to one of said first and second attachment members.

10. The circuit board damping assembly of claim 7, further comprising:

said base member having a base member hole, said first attachment member coupled to said base member hole; and said circuit board having a circuit board hole, said second attachment member coupled to said circuit board hole.

11. The circuit board damping assembly of claim 7, wherein said base member is a circuit board.

12. The circuit board damping assembly of claim 7, wherein said connector is a wire.

13. The circuit board damping assembly of claim 7, wherein said base member is a chassis.

14. A circuit board damping assembly comprising:

a first circuit board;

a second circuit board coupled in spaced relationship to said first circuit board;

a first wire washer coupled to said first circuit board, said first wire washer having an aperture;

a second wire washer coupled to said second circuit board, said second wire washer having an aperture, said aperture in said second wire washer being aligned with said aperture in said first wire washer; and a wire connecting said first and second wire washers such that said wire, said first wire washer, and said second wire washer form a node between a plurality of spacing members for damping vibration of said first circuit board and said second circuit board, wherein said first and second wire washers each have a connection portion, an offset portion, and a distal portion, said distal portion being positioned in spaced relationship to said first and second circuit boards respectively when said first and second wire washers are coupled to said first and second circuit boards; and wherein said apertures in said first and second wire washers extend through said distal portions of said first and second wire washers, wherein distal portions of said wire are twisted together to secure said wire to said first and second wire washers.

15. The circuit board damping assembly of claim 14 wherein said first and second wire washers are coupled to said first and second circuit boards equidistant between said spacing members.

* * * * *